United States Patent [19]
Arakawa

[11] Patent Number: 5,029,132
[45] Date of Patent: Jul. 2, 1991

[54] RANDOM ACCESS MEMORY DEVICE HAVING PARALLEL NON-VOLATILE MEMORY CELLS

[75] Inventor: Hideki Arakawa, Yokohama, Japan
[73] Assignee: Fujitsu Limited, Kawasaki, Japan
[21] Appl. No.: 598,590
[22] Filed: Oct. 18, 1990

Related U.S. Application Data

[63] Continuation of Ser. No. 213,015, Jun. 29, 1988, abandoned.

[30] Foreign Application Priority Data

Jul. 9, 1987 [JP] Japan ............................... 62-169678

[51] Int. Cl.$^5$ ............................................. G11C 11/34
[52] U.S. Cl. .................................... 365/185; 365/154
[58] Field of Search ............... 365/185, 200, 201, 154, 365/182, 228; 371/21

[56] References Cited

U.S. PATENT DOCUMENTS

| | | | |
|---|---|---|---|
| 4,630,238 | 12/1986 | Arakawa | 365/185 |
| 4,660,179 | 4/1987 | Aoyama | 365/200 |
| 4,703,456 | 10/1987 | Arakawa | 365/185 |
| 4,799,194 | 1/1989 | Arakawa | 365/154 |
| 4,800,533 | 1/1989 | Arakawa | 365/228 |

Primary Examiner—Aristotelis M. Psitos
Assistant Examiner—Andrew L. Sniezek
Attorney, Agent, or Firm—Armstrong, Nikaido, Marmelstein, Kubovcik & Murray

[57] ABSTRACT

A non-volatile random access memory device comprising a plurality of memory cells, each of the memory cells comprising, a volatile memory cell and a pair of non-volatile memory cells connected to the volatile memory cell for storing data from the volatile memory cell and for recalling the stored data to the volatile memory cell, each of the pair of non-volatile memory cells comprising a first transistor having a floating gate, a tunnel capacitor having one electrode connected to the floating gate, a write circuit operatively connected to both electrodes of the tunnel capacitor, the polarities of potentials applied to both electrodes of the tunnal capacitor being changed in accordance with the data from the volatile memory cell so that electrons are injected to the floating gate or emitted from the floating gate through the tunnel capacitor and the potential at the floating gate is controlled in accordance with the data from the volatile memory cell, and a recall circuit for recalling the data from the corresponding non-volatile memory cell to the volatile memory cell in accordance with the potential at the floating gate.

9 Claims, 6 Drawing Sheets

Fig. 4
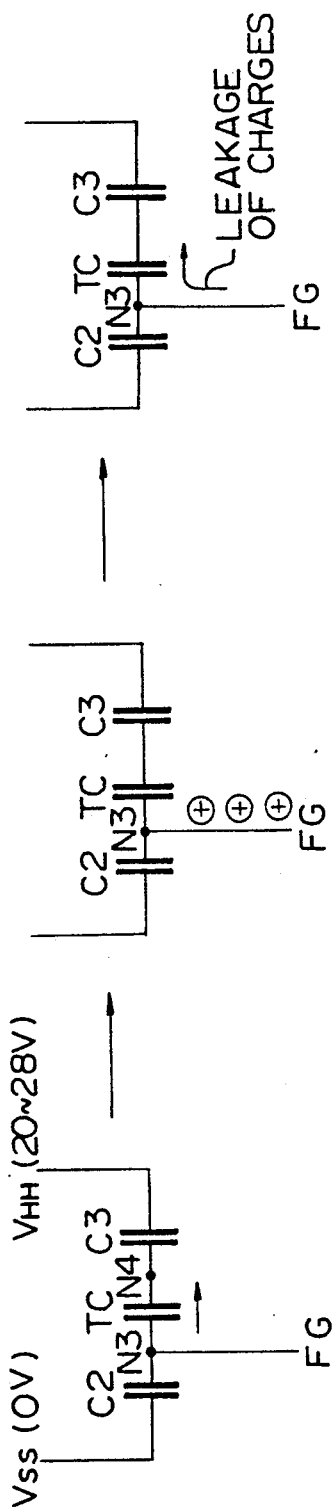
(a) CHARGED STATE OF FLOATING GATE FG
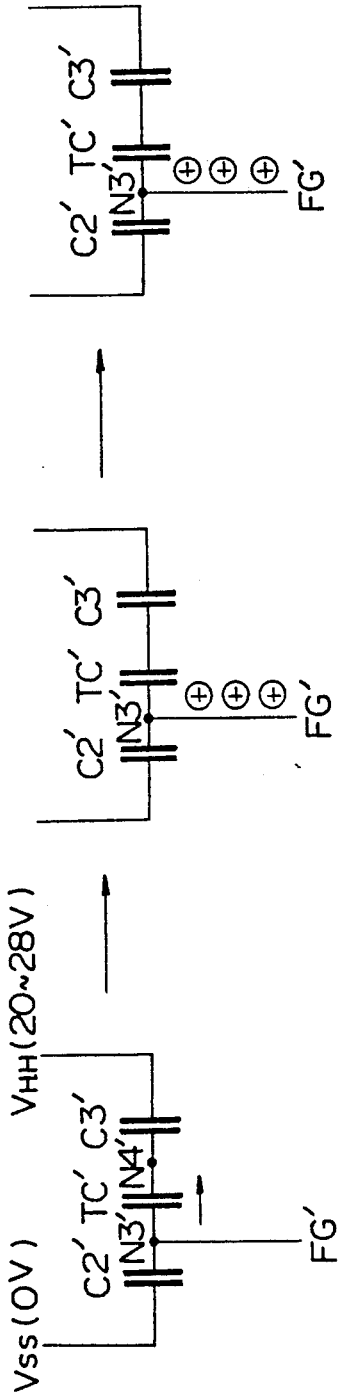
(b) CHARGED STATE OF FLOATING GATE FG'

RANDOM ACCESS MEMORY DEVICE HAVING PARALLEL NON-VOLATILE MEMORY CELLS

This application is a continuation of application Ser. No. 213,015 filed June 29, 1988 now abandoned.

BACKGROUND OF THE INVENTION (1) Field of the Invention

The present invention relates to a nonvolatile random access memory device, more particularly, it relates to an improvement of a non-volatile random access memory device having a plurality of memory cells, each of the memory cells comprising a volatile static type random access memory cell and a non-volatile memory cell including a memory transistor having a floating gate.

Such a non-volatile random access memory device not only carries out data read/write operations at a high speed, due to the static type random access memory cell, but also holds the written data while the power source supplied to the memory cells is cut OFF, memory devices are generally used in the field of, for example, electronic musical instruments, IC cards, facsimiles, telephones, wherein stored date must be held while the power source for the memory cells is cut OFF and the stored data can be rewritten as new data when the above power source is made ON.

(2) Description of the Related Art

Generally, the conventional non-volatile random access memory device of this type has a plurality of memory cells, each of which comprises a volatile static type random access memory cell including a flip-flop circuit and a non-volatile memory cell including a tunnel capacitor and a memory transistor having a floating gate.

Predetermined data is written from bit lines to the flip-flop circuit in the volatile memory cell, and the data is read out from the flip-flop circuit to the bit lines, when a corresponding word line is selected.

The non-volatile memory cell stores the data from the corresponding volatile memory cell before the power source applied to the volatile memory cell is cut OFF and recalls the stored data to the volatile memory cell when the power source is again applied to the volatile memory cell.

When storing the data from the volatile memory cell to the non-volatile memory cell, electrons are tunneled from an electrode of the tunnel capacitor connected to the floating gate to an opposing electrode of the tunnel capacitor, or vice versa, through an insulator film of the tunnel capacitor to which an electric field having a predetermined high intensity is applied, in accordance with the data from the corresponding volatile memory cell. Accordingly, the potential at the floating gate in the non-volatile memory cell becomes positive (i.e., positively charged state) or negative (i.e., negatively charged state), in accordance with the data from the corresponding volatile memory cell. Namely, the data from the volatile memory cell is stored to the corresponding non-volatile memory cell as a predetermined potential (i.e., in a predetermined charged state) at the floating gate.

Next when recalling the data stored in the non-volatile memory cell to the volatile memory cell, the flip-flop circuit in the volatile memory cell is initially preset at a predetermined state. At this time, a recall signal is supplied to the non-volatile memory cell (i.e., to a gate of a recall transistor connected to the memory transistor having the floating gate in series), and if the potential at the floating gate is negative, the memory transistor is cut-OFF, and thus the flip-flop circuit in the volatile memory cell is maintained in the above preset state, even if the recall signal is supplied to the recall transistor. On the other hand, if the potential at the floating gate is positive, the memory transistor is made ON, and thus the data preset in the flip-flop circuit is inverted in accordance with the data recalled from the corresponding non-volatile memory cell through the memory transistor which is ON and the recall transistor to which the recall signal is supplied. As a result, the data corresponding to the potential at the floating gate (i.e., the data corresponding to the ON or OFF state of the memory transistor) is recalled from the non-volatile memory cell to the flip-flop circuit in the volatile memory cell.

Therefore, in the memory device of this type, the above-mentioned data storing operation and data recalling operation between the volatile memory cell and the non-volatile memory cell are necessarily repeated many times, in accordance with users' commands. In this connection, the number of times that the repetition of the above data storing operation and data recalling operation can be carried out is guaranteed by the maker, but the above non-volatile memory cell may deteriorate due to a repetition of operations, although within the above guaranteed number, because of a defect therein, particularly in the insulator film of the tunnel capacitor. Namely, when storing the data from the volatile memory cell to the non-volatile memory cell, a predetermined high potential is applied between both electrodes of the tunnel capacitor, and thus a problem arises in that the insulator film of the tunnel capacitor is deteriorated or destroyed in accordance with the increase of the above number of operations, and further, the above charges having a predetermined polarity at the floating gate tend to leak through the insulator film of the tunnel capacitor, with the result that the value of the above potential at the floating gate changes to an erroneous value which does not correspond to the data to be stored in the non-volatile memory cell.

In view of the above-mentioned problem, attempts have been made to provide an error check and correct circuit (so-called ECC circuit) together with the above memory device on the same chip. But, in such a memory device, the chip area needed for the ECC circuit occupies a remarkably large part of the entire chip area, particularly when the bit number constituting one word data is relatively small, and further, the entire circuit construction of the memory device becomes complicated even when only one erroneous bit included in the one word output data is detected and corrected, as described below in detail.

SUMMARY OF THE INVENTION

The present invention is intended to solve the above-mentioned problems, and the main object of the present invention is to enable the correction of the erroneous bit generated in each of the defective non-volatile memory cells, by a relatively simple construction, and without providing additional complicated circuits such as the ECC circuit.

The present invention is based on the concept that the erroneous data generated in the defective non-volatile memory cell, which cause charges having a predetermined polarity at the floating gate to leak through the insulator film of the tunnel capacitor, always coincides with predetermined data corresponding to an OFF state of the memory transistor.

Based on the above concept, according to the present invention, there is provided a non-volatile random access memory device comprising a plurality of memory cells, each of the memory cells comprising:
a volatile memory cell; and a pair of non-volatile memory cells connected to the volatile memory cell, for storing data from the volatile memory cell and for recalling the stored data to the volatile memory cell, each of the pair of non-volatile memory cells comprising a first transistor having a floating gate, a tunnel capacitor having one electrode connected to the floating gate, a write circuit operatively connected to both electrodes of the tunnel capacitor, the polarities of potentials applied to both electrodes of the tunnel capacitor being changed in accordance with the data from the volatile memory cell so that electrons are injected to the floating gate or emitted from the floating gate through the tunnel capacitor and the potential at the floating gate is controlled in accordance with the data from the volatile memory cell, and a recall circuit for recalling the data from the corresponding non-volatile memory cell to the volatile memory cell in accordance with the potential at the floating gate.

According to the above construction, even if one of the non-volatile memory cells becomes defective, the data is correctly recalled from the remaining non-volatile memory cell to the volatile memory cell in accordance with the potential at the floating gate of the memory transistor (i.e., in accordance with an ON or OFF state of the memory transistor) provided in the remaining normal non-volatile memory cell.

BRIEF DESCRIPTION OF THE DRAWINGS

FIGS. 4A and 4B are diagrams showing the change of the charged state at the floating gate in the non-volatile memory cell shown in FIG. 2;

DESCRIPTION OF THE PREFERRED EMBODIMENTS

Figure 1:
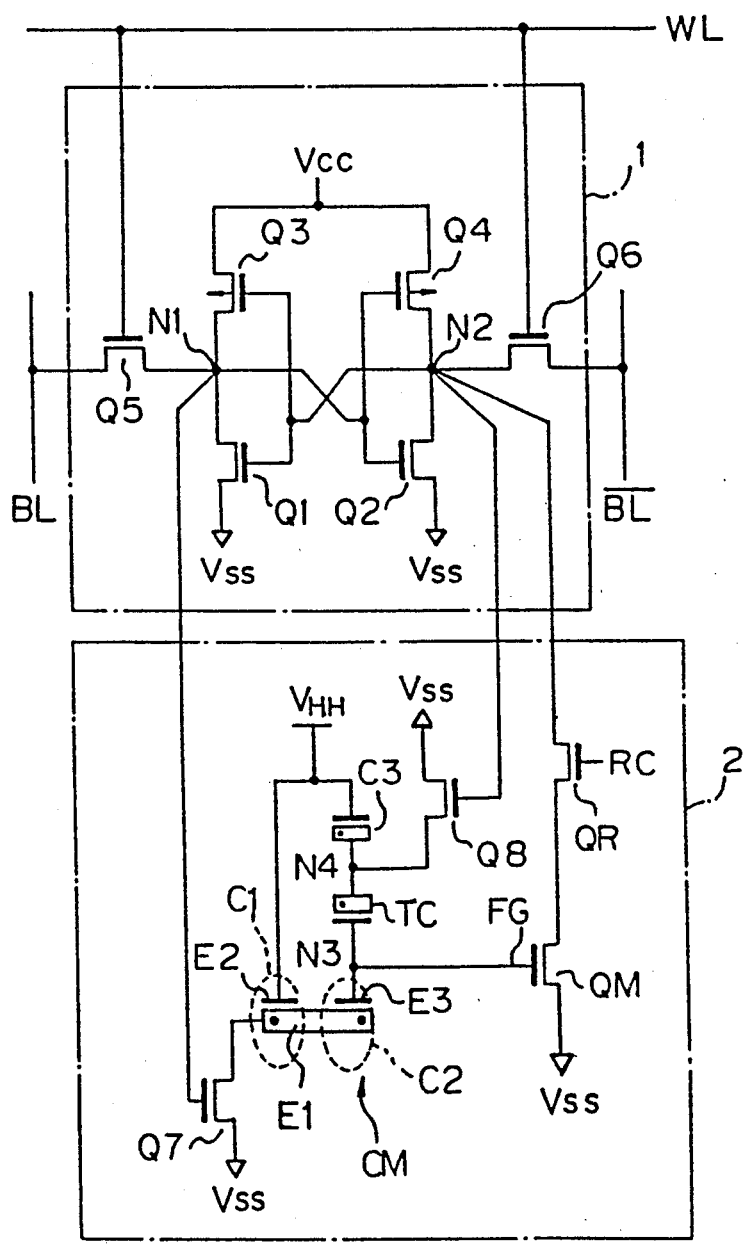
FIG. 1 is a circuit diagram showing a conventional memory cell including a volatile memory cell and a non-volatile memory cell.

To clarify the background of the present invention, a conventional memory cell including a volatile memory cell and a non-volatile memory cell is shown in FIG. 1.

Reference numeral 1 denotes a volatile memory cell which is constituted as a static random access memory cell including a flip-flop circuit. The flip-flop circuit includes N channel type transistors Q1, Q2, and P channel type transistors Q3, Q4. A transfer gate transistor Q5 is connected between a bit line BL and one output node N1 of the flip-flop circuit, and a transfer gate transistor Q6 is connected between a bit line $\overline{BL}$ and the other output node N2 of the flip-flop circuit. The gates of the transfer gate transistors Q5 and Q6 are connected to a word line WL. A predetermined data is written from the bit lines BL and $\overline{BL}$ to the flip-flop circuit through the transfer gate transistors Q5 and Q6, and a predetermined data is read out from the flip-flop circuit to the bit lines BL and $\overline{BL}$ through the transfer gate transistors Q5 and Q6, when the word line WL connected to the gate of the above transfer gate transistors is selected.

Reference numeral 2 denotes a non-volatile memory cell which stores data from the above volatile memory cell before the power source potential $V_{CC}$ applied to the volatile memory cell is cut OFF and recalls the stored data to the volatile memory cell when the power source potential $V_{CC}$ is again applied to the volatile memory cell. The non-volatile memory cell 2 comprises N channel enhancement type transistors Q7 and Q8, an N channel enhancement type transistor QR which is turned ON in response to a recall signal RC supplied to the gate of the transistor QR when the recall operation is carried out, an N channel enhancement type memory transistor QM having a floating gate FG, a capacitor module CM including capacitors C1 and C2, a capacitor C3, and a tunnel capacitor TC having one electrode formed by a part of the above floating gate and the other electrode formed by a diffusion region (source or drain region) provided in the semiconductor substrate. The capacitor C2 has one electrode E1 formed by the above diffusion region and the other electrode E3 formed by a part of the above floating gate, and the capacitor C1 has the above one electrode E1 and the other electrode E2 formed by a gate corresponding to the gate of MOS transistor. Similarly, the capacitor C3 has one electrode formed by the above diffusion region and the other electrode formed by the gate corresponding to the gate of MOS transistor.

In this connection, the above tunnel capacitor TC is provided with an insulator film, having a thickness of about 100 Å (angstroms), between the above two electrodes, and when an electric field having an intensity of about 10 MV/cm (megavolts/cm) is applied between the above two electrodes, the electrons are tunneled from the low potential electrode to the high potential electrode through the insulator film, due to the tunnel effect.

The storing operation and the recalling operation of the above memory cell will be described below.

First, when storing the data from the volatile memory cell to the non-volatile memory cell, it is assumed that the potential of the node N1 is low level and the potential of the node N2 is high level, as the data of the volatile memory cell.

Accordingly, the power source having the high potential $V_{HH}$ of about 20 to 28 volts is applied to the non-volatile memory cell. At that time, the transistor Q7 is turned OF and the transistor Q8 is turned ON due to the above potential levels of the nodes N1 and N2, and thus the potential level of a node N4 in the non-volatile memory cell becomes low level (i.e., nearly equal to $V_{SS}$ level). As a result, the above high potential $V_{HH}$ is applied to the circuit through which the capacitors C1 and C2 and the tunnel capacitor TC are connected in series. Thus, electrons are injected from the node N4 (i.e., low potential side electrode of the tunnel capacitor) to the node N3 (i.e., high potential side electrode of the tunnel capacitor, which electrode constitutes a part of the floating gate), due to the above tunnel effect caused by the tunnel capacitor. As a result, the above injected electrons (i.e., charges having a negative polarity) are stored at the floating gate FG of the transistor QM.

As above-mentioned, the data of the volatile memory cell 1 (in this case, data such that the potential levels of the nodes N1 and N2 corresponds to low level and high level, respectively) is stored in the non-volatile memory cell as the negative potential (i.e., negatively charged state) at the floating gate FG.

On the other hand, if it is assumed that the potential of the node N1 is high level and the potential of the node N2 is low level, when storing the data from the volatile memory cell to the non-volatile memory cell, the transistor Q7 is turned ON and the transistor Q8 is turned OFF. As a result, the above high potential $V_{HH}$ is applied to the circuit through which the capacitor C3, the tunnel capacitor TC, and the capacitor C2 are connected in series. Thus, electrons are emitted from the floating gate FG corresponding to the node N3 (i.e., low potential side electrode of the tunnel capacitor) to the node N4 (i.e., high potential side electrode of the tunnel capacitor) through the tunnel capacitor. As a result, the data of the volatile memory cell such that the potential levels of the nodes N1 and N2 correspond to high level and low level, respectively, is stored to the non-volatile memory cell as the positive potential (i.e., positively charged state) at the floating gate FG, due to the above emission of the electrons from the floating gate.

Next, when recalling the data stored in the non-volatile memory cell to the volatile memory cell, it is assumed that the flip-flop circuit in the volatile memory cell is initially preset to a state wherein the potentials of the nodes N1 and N2 are low level and high level, respectively. Accordingly, the recall signal RC having a predetermined high potential is supplied to the gate of the transistor QR, and at that time, if the potential at the floating gate FG is negative (i.e., negatively charged state), the transistor QM is cut-OFF, and thus the source of the recall transistor QR is electrically separated from a power source line having a low potential $V_{SS}$. At that time, in the volatile memory cell, the potentials of the nodes N1 and N2 are maintained in the above preset state (i.e., the potential of the nodes N1 and N2 are low level and high level, respectively.) Namely, the data corresponding to the negative potential at the floating gate FG is recalled from the non-volatile memory cell to the volatile memory cell as the data such that the potentials of the nodes N1 and N2 are low level and high level, respectively.

On the other hand, if the potential at the floating gate FG is positive when the above recall signal RC is supplied to the gate of the transistor QR, the transistor QM is ON, and thus in the volatile memory cell, the potential of the node N2 is lowered to the low level $V_{SS}$ through the turned-ON transistors QR and QM, and conversely, the potential of the node N2 is raised to high level $V_{CC}$ based on the operation of the flip-flop circuit. Thus, the data corresponding to the positive potential at the floating gate is recalled from the non-volatile memory cell to the volatile memory cell as the data such that the potentials of the nodes N1 and N2 are high level and low level, respectively.

Thus, in the memory device of this type, the above-mentioned data storing operation and data recalling operation are necessarily repeated many times between the volatile memory cell and the non-volatile memory cell, due to users' commands In this connection, the number of times that the repetition of the above data storing operation and data recalling operation can be carried is guaranteed by the maker, i.e., for example, a guarantee of ten thousand times.

Nevertheless, the above non-volatile memory cell may become defective before the above guaranteed number of times has been reached, due to the occurrence of a defect in, particularly, the insulator film of the tunnel capacitor (e.g., due to deterioration or destruction of the insulator film, dust in the insulator film, defective patterning of the insulator film, and so on). Namely, when storing the data from the volatile memory cell to the non-volatile memory cell, a large part of the above high potential $V_{HH}$ is applied between both electrodes of the tunnel capacitor, and thus a problem arises in that the insulator film of the tunnel capacitor is deteriorated or destroyed by an increase of the number of times of repetition, and further, the above charges having a predetermined polarity stored at the floating gate may leak through the insulator film of the tunnel capacitor, and as a result, the value of the above potential at the floating gate may be erroneous and will not correspond to the data to be stored in the non-volatile memory cell.

In view of the above-mentioned problem, attempts have been made to provide an error check and correct circuit (ECC circuit) together with the above memory device on the same chip. In this case, the memory device must be additionally provided with a test data generating circuit which produces predetermined test data in accordance with input data supplied to memory cells for storing the input data, additional memory cells for storing the above produced test data, an additional sense amplifier for amplifying the read data from the above additional memory cells, an error correction signal generating circuit which detects an erroneous bit data included in the output data from a sense amplifier for amplifying the read data from the above memory cells and generates the error correction signal for inverting the erroneous bit data in accordance with the output data from the above sense amplifier and the additional sense amplifier, and an exclusive-OR gate to which the above output data from the sense amplifier and the output from the error correction signal generating circuit are supplied. Thus, according to the above construction, even if the erroneous bit data is included in the stored data in one of the memory cells (i.e., in the output data from the sense amplifier), the corrected data can be obtained through the above exclusive-OR gate.

In this connection, to enable the detection and the correction of one erroneous bit included in the output data of one word, if it is assumed that the one word data is constituted by $2^n$ bits, it is necessary to provide test data constituted by $(n+1)$ bits for each word. For example, if the one word data is constituted by 8 bits, it is necessary to provide test data constituted by 4 bits for each word.

Thus, in the memory device having the above ECC circuit construction, the ratio between the number of the additional memory cells for storing the test data for each word and the number of the memory cells for storing the essential data becomes relatively high, particularly when the bit number constituting the one word data is relatively small. For example, if the number of the memory cells for storing the one word data is eight (i.e., if the one word data is constituted by 8 bits), it is necessary to provide four additional memory cells for the above eight memory cells in order to store the test data for each word (i.e., the test data for each word must be constituted by 4 bits), even in the case wherein only one erroneous bit included in the one word output data is detected and corrected. Accordingly, the chip area needed for the additional memory cells for storing the test data occupies a relatively large part of the entire chip area, particularly when the bit number constituting the one word data is relatively small, even when only one erroneous bit included in the one word output data is detected and corrected.

Further, as above-mentioned, in the memory device having the above ECC circuit construction, it is necessary to provide the above test data generating circuit and the error correction signal generating circuit, and so on, besides the above additional memory cells, and as a result, the chip area needed for the ECC circuit is further increased, and the entire circuit construction of the memory device becomes remarkably complicated.

Thus, in the memory device having a relatively small capacity (e.g., 256 bits or 1 Kilobits), the chip area needed for the above ECC circuit including not only the above additional memory cells for storing the test data for each word but also the test generating circuit, the error correction signal generating circuit and so on, occupies a remarkably large part of the entire chip area, and further, the entire circuit construction of the memory device becomes remarkably complicated, even when only one erroneous bit included in the one word output data is detected and corrected.

The present invention is intended to solve the above-mentioned problems, in that the memory device according to the present invention enables the correction of erroneous bit data generated in each of the defective non-volatile memory cells, only by adding one more non-volatile memory cell to each of the memory cells of the above type, and without providing additional complicated circuits such as the above ECC circuit.

Figure 2:
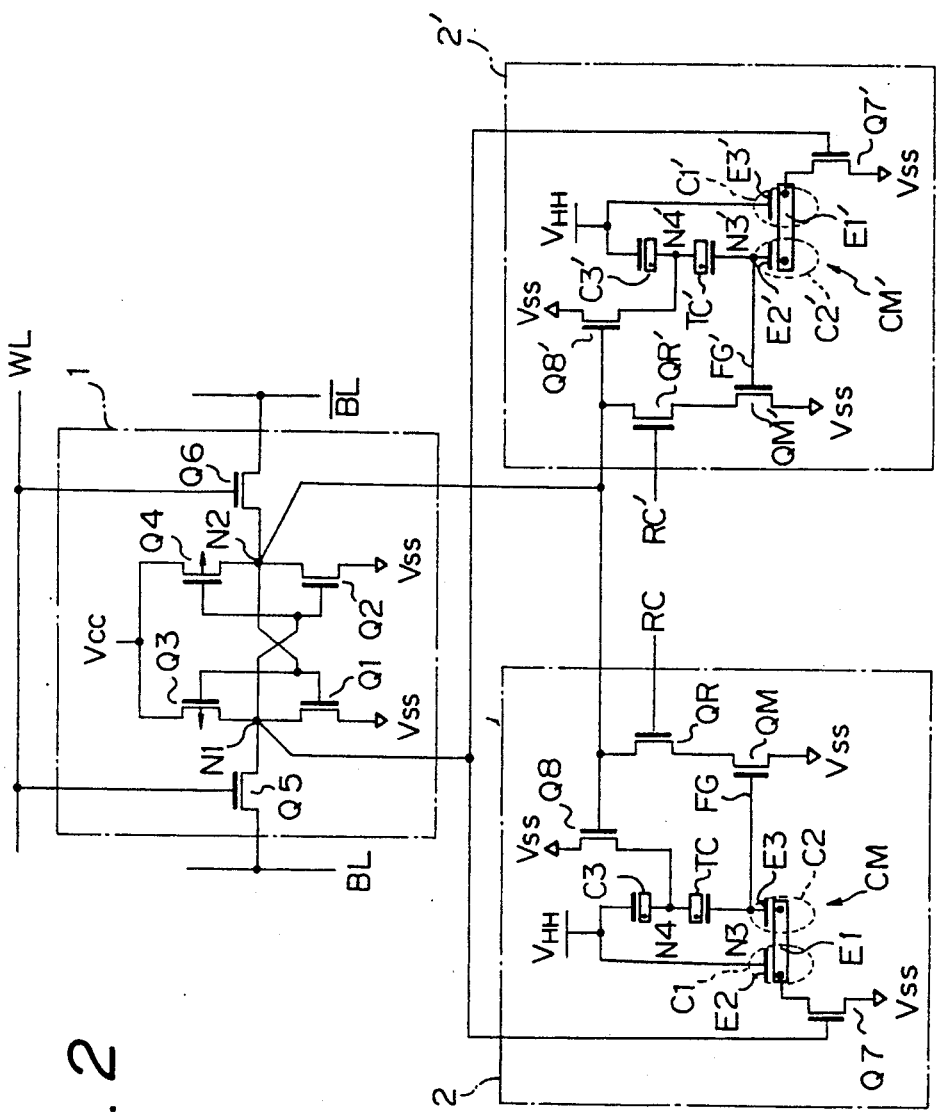
FIG. 2 is a circuit diagram showing one embodiment of the memory cell used in the non-volatile memory device according to the present invention.

FIG. 2 shows one embodiment of the memory cell used in the non-volatile memory device according to the present invention. As shown in FIG. 2, the memory cell according to the present invention, comprises a volatile memory cell 1 (corresponding to the volatile memory cell shown in FIG. 1) and two non-volatile memory cells 2 and 2', each connected to the volatile memory cell. The non-volatile memory cell 2 corresponds to the non-volatile memory cell shown in FIG. 1, and the other non-volatile memory cell 2' has the same construction as that of the non-volatile memory cell 2. Also, in the non-volatile memory cell 2', the same reference symbols as in the non-volatile memory cell 2 are used, with the addition of a "dash", for portions corresponding to those already shown in the non-volatile memory cell 2.

Namely, the non-volatile memory cell 2' comprises N channel enhancement type transistors Q7' and Q8' each having a gate connected to the nodes N1 and N2, respectively, an N channel enhancement type transistor QR' which is turned ON in response to a recall signal RC' supplied to the gate thereof when the recall operation is carried out, an N channel enhancement type memory transistor QM' having a floating gate FG', a capacitor module CM' including capacitors C1' and C2', a capacitor C3', and a tunnel capacitor TC' having a similar construction to that of the tunnel capacitor TC in the non-volatile memory cell 2. Also, the capacitors C1' and C2' provided in the capacitor module CM', and the capacitor C3' have a similar construction as that of the capacitors C1, C2, and C3 in the non-volatile memory cell 2.

Figure 3:
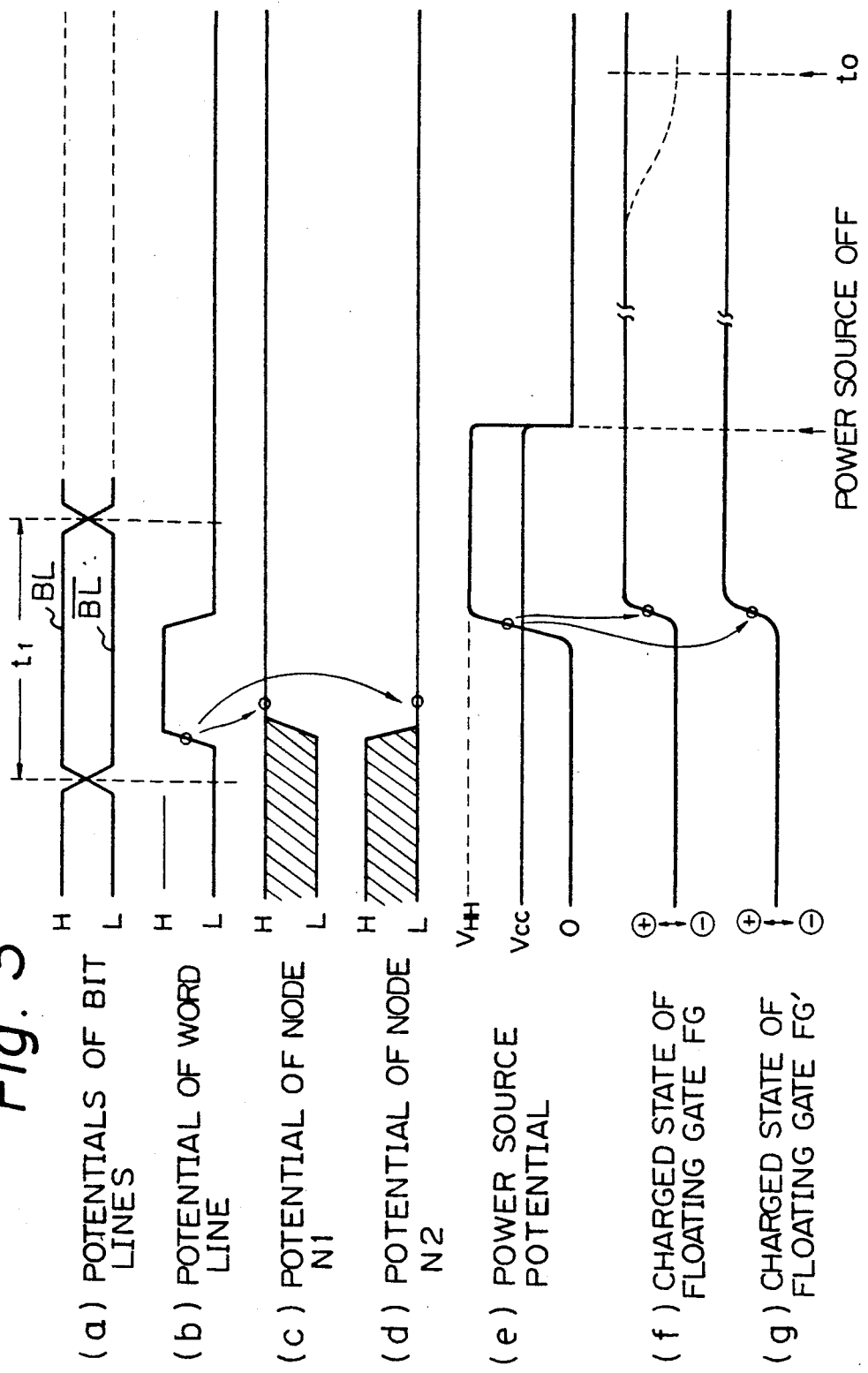
FIGS. 3A–3G are diagrams showing timing chart explaining the storing operation according to the memory cell shown in FIG. 2.
Figure 5:
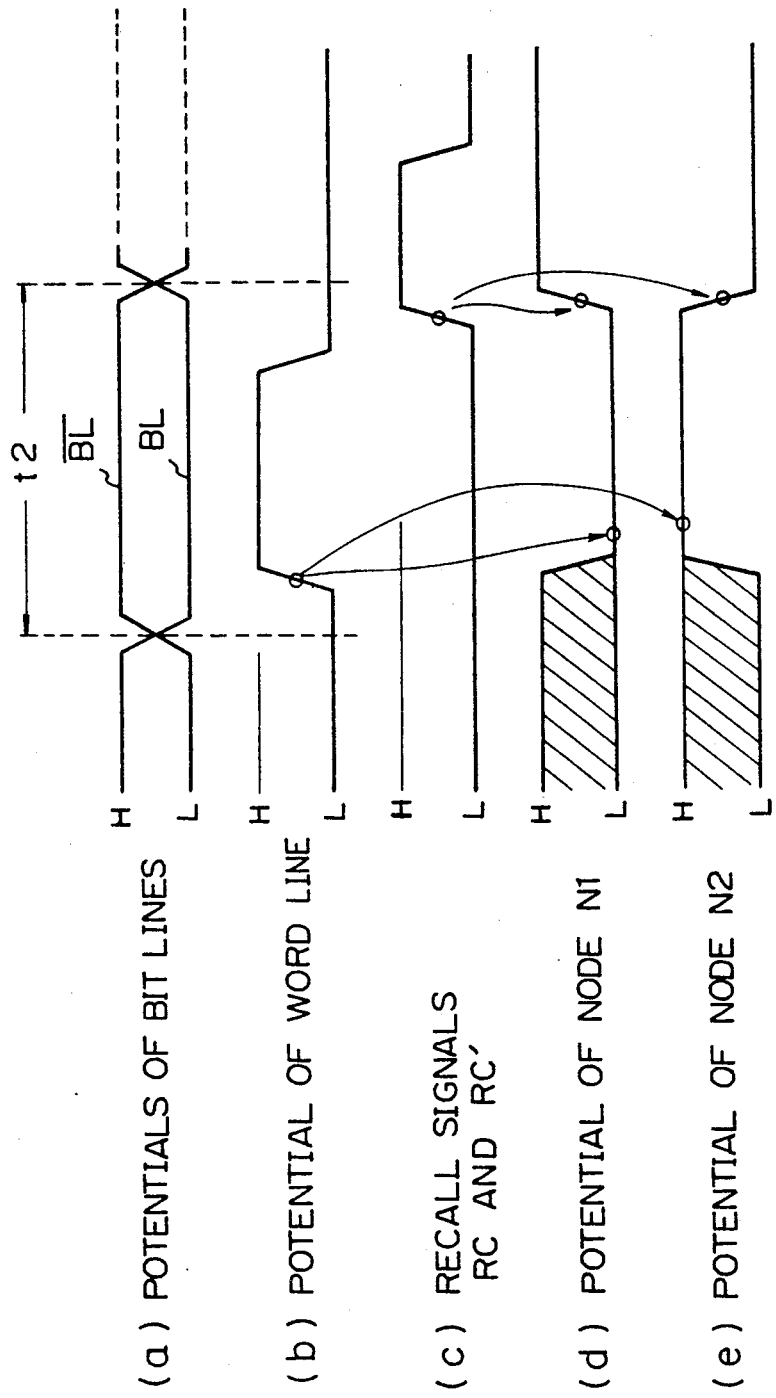
FIGS. 5A–5E are diagrams showing timing chart explaining the recall operation according to the memory cell shown in FIG. 2.

The storing operation and the recalling operation of the memory cell shown in FIG. 2 are described in detail by referring to FIGS. 3 to 5.

First, when carrying out the storing operation, if it is assumed that the potential of the word line WL is raised in the duration t1 during which the potentials of the bit lines BL and BL are high level and low level, respectively, as shown in FIG. 3(a) and FIG. 3(b), the transfer gate transistors Q5 and Q6 are turned ON, and thus the potentials of the nodes N1 and N2 become high level and low level, respectively, as shown in FIG. 3(c) and FIG. 3(d). In this connection, the hatched parts shown in FIG. 3(c) and FIG. 3(d) indicate that the potentials of the nodes N1 and N2 are indefinite during this period, respectively.

Accordingly, a power source having a high potential $V_{HH}$ of about 20 to 28 volts is applied to the non-volatile memory cells 2 and 2' as shown in FIG. 3(e). At that time, the transistors Q7 and Q7' are turned ON and the transistors Q8 and Q8' are turned OFF, due to the above potential levels of the nodes N1 and N2, and thus the above high potential $V_{HH}$ is applied to the circuit through which the capacitor C3, the tunnel capacitor TC, and the capacitor C2 are connected in series and to the circuit through which the capacitor C3', the tunnel capacitor TC', and the capacitor C2' are connected in series. As a result, electrons are emitted from the floating gate FG (i.e., from the node N3) to the node N4 through the tunnel capacitor TC, and similarly, from the floating gate FG' (i.e., from the node N3') to the node N4' through the tunnel capacitor TC'. Therefore, the data of the volatile memory cell such that the potential levels of the nodes N1 and N2 correspond to high level and low level, respectively, is stored to the non-volatile memory cells 2 and 2', as the positive potentials (i.e., the positively charged states) at the floating gates FG and FG', as shown in FIG. 3(f), FIG. 3(g), and the center portion of FIG. 4(a) and FIG. 4(b).

Conversely, the data of the volatile memory cell such that the potential levels of the nodes N1 and N2 correspond to low level and high level, respectively, is stored to the non-volatile memory cells 2 and 2', as the negative potentials (i.e., the negatively charged states) at the floating gates FG and FG'.

After the above storing operation is completed, the power sources having the potentials $V_{CC}$ and $V_{HH}$ are cut OFF from the volatile memory cell and the non-volatile memory cells, as shown in FIG. 3(e). Accordingly, if the tunnel capacitors TC and TC' in the non-volatile memory cells are not defective, the above potentials (i.e., the charged states) at the floating gates FG and FG' are not changed, and thus the data which was stored in the volatile memory cell before the power sources were cut OFF is correctly stored to the non-volatile memory cells 2 and 2' until the next recalling operation is carried out, as shown by the real lines in FIG. 3(f) and FIG. 3(g).

Thus, when carrying out the recalling operation, if the non-volatile memory cells 2 and 2' are not defective (i.e., if the tunnel capacitors TC and TC' are not defective), the non-volatile memory cells 2 and 2' perform the same recalling operation as described with regard to the non-volatile memory cell 2 shown in FIG. 1, to recall the stored data in the non-volatile memory cells 2 and 2' to the volatile memory cell 1. In this connection, the power source potential $V_{CC}$ is applied to the volatile memory cell when carrying out the above recalling operation.

Conversely, if it is assumed that one of the tunnel capacitors (in this case, the tunnel capacitor TC) is defective, the charges stored at the floating gate FG leak through the insulator film of the tunnel capacitor TC, and thus the charges stored at the floating gate FG of the transistor QM (in this case, positive charges) are extinguished due to the above leakage, as shown in the right portion of FIG. 4(a), and the positive potential at the floating gate FG is lowered at the timing to (i.e., at the timing before the recalling operation is carried out), as shown by the dotted line in FIG. 3(f). Therefore, the potential at the floating gate FG (i.e., the node N3) becomes equal to that of the node N4, which potential becomes almost zero except when the above storing operation is carried out, due to the above leakage.

The recalling operation under this condition will be described below. First, the potential of the word line WL is raised in the preset duration t2 during which the low potential and the high potential are supplied from the bit lines BL and $\overline{BL}$ to the nodes N1 and N2 in the volatile memory cell, respectively, and the flip-flop circuit in the volatile memory cell is preset under the state that the potentials of the nodes N1 and N2 are low level and high level, respectively, through the turned ON transistors Q5 and Q6, as shown in the center portion of FIG. 5(a) to FIG. 5(e). Then, the potentials of the recall signals RC and RC' are raised to high level as shown in the right portion of FIG. 5(c), and thus both of the recalling transistors QR and QR' can be turned ON.

Nevertheless, in the non-volatile memory cell 2, the charges (in this case, positive charges) stored at the floating gate FG of the transistor QM, have been extinguished and the potential at the floating gate FG has become nearly equal to zero, as above-mentioned, and thus the transistor QM is in the cut-OFF state even if the recall signal RC is supplied to the gate of the transistor QR. As a result, the non-volatile memory cell 2 is electrically separated based on the cut-OFF state of the transistor QM. In other words, the defective non-volatile memory cell 2 does not have any effect on the volatile memory cell when carrying out the recalling operation.

On the other hand, in the non-volatile memory cell 2', the charges (in this case, positive charges) are stored at the floating gate FG' of the transistor QM' (i.e., the potential of the floating gate FG' is positive), and thus the transistor QM' is made ON. Also, the recalling transistor QR' is turned ON by supplying the recell signal RC' as above-mentioned, and thus the potential of the node N2 is lowered to low level ($V_{SS}$ level) through the transistors QM' and QR', as shown in the right portion of FIG. 5(e). Further, the potential of the node N1 is raised to high level by the operation of the flip-flop circuit, as shown by the right portion of FIG. 5(d).

Thus the data which was stored from the volatile memory cell 1 to the non-volatile memory cells 2 and 2' before the power sources were cut OFF (i.e., the data such that the potential levels of the nodes N1 and N2 correspond to high level and low level, respectively) is correctly recalled from the non-volatile memory cell 2' to the volatile memory cell 1, even if the non-volatile memory cell 2 is defective. In this connection, when the negative charges (electrons) are stored at the floating gate FG' of the transistor QM' (i.e., the transistor QM' is turned-OFF. Thus, the potential levels of the nodes N1 and N2 are maintained in the above preset state (i.e., the potential levels of the nodes N1 and N2 correspond to low level and high level, respectively).

As above-mentioned, even if one of the above non-volatile memory cells 2 and 2' is defective, the data recalling operation is correctly carried out from the remaining non-volatile memory cell to the volatile memory cell in accordance with the polarity of charges stored at the floating gate of the memory transistor (i.e., in accordance with an ON or OFF state of the memory transistor) provided in the remaining normal non-volatile memory cell.

In the above embodiment, a common recall signal is used as the recall signals RC and RC' for two non-volatile memory cells when the memory device is actually used, but when the test for the memory device is carried out before leaving the production line, it is necessary to carry out a confirmation test of the recalling operation for each of the above two non-volatile memory cells.

Figure 6:
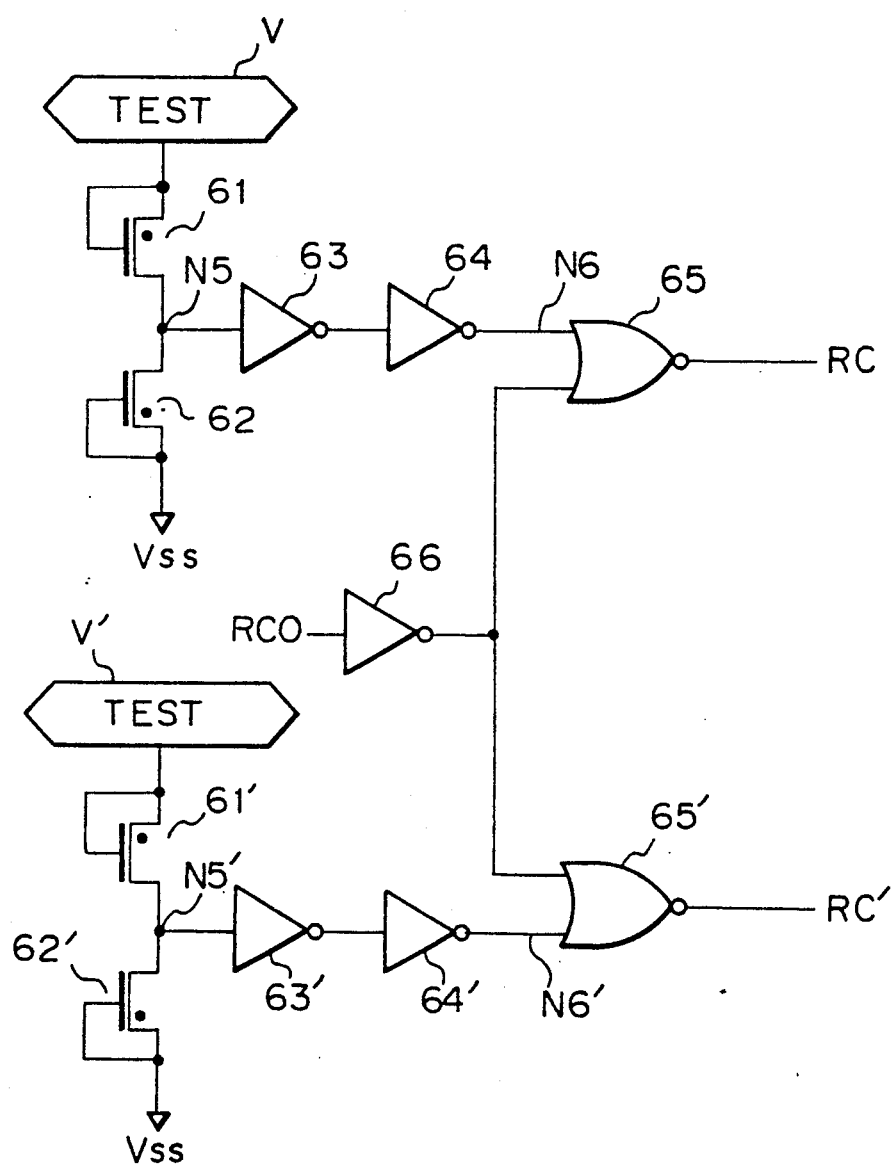
FIG. 6 is a circuit diagram showing an example of a test circuit for carrying out the test of the recalling operation for the memory cell shown in FIG. 2.

FIG. 6 shows an example of a test circuit for carrying out this test of the recalling operation for each of the non-volatile memory cells. In FIG. 6, in the test circuit portion for the non-volatile memory cell 2', the same reference symbols as in the test circuit portion for the non-volatile memory cell 2 are used, with the addition of a "dash", for portions corresponding to those in the test circuit portion for the non-volatile memory cell 2.

In the test circuit for the non-volatile memory cell 2, reference symbol V corresponds to the power source having a predetermined high potential for the test of the recalling operation, and N channel depletion type transistors 61 and 62 are connected in series between the power source V (i.e., a test terminal to which the power source V is connected) and the low potential power source line $V_{SS}$. A node N5 corresponding to the connection point of the transistors 61 and 62 is connected to one input (a node N6) of NOR gate 65 through inverters 63 and 64. Also, an essential recall signal RCO is supplied to the other input of the NOR gate 65 through an inverter 66. Thus, the recall signal RC is supplied from the output of the NOR gate 65 to the gate of the recalling transistor QR in the non- volatile memory cell 2 shown in FIG. 2. Also, the recall signal RC' is supplied from the output of the NOR gate 65' to the gate of the recalling transistor QR' in the non-volatile memory cell 2', through the test circuit portion for the non-volatile memory cell 2', which test circuit portion has the same construction as that of the test circuit portion for the non-volatile memory cell 2.

When carrying out the test of the recalling operation by using the above test circuit shown in FIG. 6, at the first stage, the potential of the common recall signal RCO is set to high level. In this condition, when the test of the recalling operation for the non-volatile memory cell 2 is carried out, the potential of the power source V' is set to 5 volts, for example, and thus the potential of the node N5' is set to high level. Accordingly, the potential of the node N6' becomes high level, and as a result, the potential of the recall signal RC' becomes low level, and therefore, the recalling transistor QR' in the non-volatile memory cell 2' is cut-OFF, and thus the recalling operation for the non-volatile memory cell 2' does not occur.

The potential of the power source V is then set to 5 volts, for example, and the potentials of the nodes N5 and N6 are set to high level. At that time, the potential of the recall signal RC becomes low level, and thus the recalling transistor QR in the non-volatile memory cell 2 also is cut-OFF and the recalling operation for the non-volatile memory cell 2 also does not occur. Next, the potential of the power source V is set to zero volts, for example, and the potentials of the nodes N5 and N6 are set to low level. Accordingly, as the potential of the recall signal RC supplied from the output of the NOR gate 65 becomes high level, the recalling transistor QR is made ON, and thus the test of the recalling operation for the non-volatile memory cell 2 is carried out. Then a similar operation is repeated for carrying out the test of the recalling operation for the non-volatile memory cell 2'.

After the above confirmation test of the recalling operation for each of the non-volatile memory cells 2 and 2' is completed, the power sources V and V" for carrying out the test of the recalling operation are separated from the transistors 61 and 61' (i.e., from the test terminals), and as a result, the potentials of the nodes N5 an N5' and the nodes N6 and N6' are all set to low level, and thus both potentials of the recall signals RC and RC' supplied from the outputs of the NOR gates 65 and 65' are similarly changed in accordance with the potential change of the essential recall signal (the common recall signal) RCO.

In the above embodiments shown in FIG. 2, the flip-flop circuit in the volatile memory cell 1 is constructed by P channel type transistors and N channel type transistors (i.e., a CMOS construction), but, it is also possible to construct the flip-flop circuit by only N channel type transistors (i.e., an NMOS construction), for example.

According to the present invention, it is possible to carry out the correction of the erroneous bit data generated in each of the defective non-volatile memory cells, by a relatively simple construction (i.e., by adding only one more non-volatile memory cell to each of the memory cells of the above type), without providing additional complicated circuits such as the ECC circuit.

I claim:

1. A non-volatile random access memory device having a plurality of memory cells, each of said memory cells comprising:
    a volatile memory cell for storing data received and having input/output nodes for inputting and outputting the data; and
    a pair of non-volatile memory cells, connected to the input/output nodes of said volatile memory cell, for storing said data from said volatile memory cell and for recalling stored data to said volatile memory cell, each non-volatile memory cell of said pair of non-volatile memory cells including
    (a) a first transistor having a floating gate,
    (b) a tunnel capacitor having one electrode connected to said floating gate,
    (c) a write circuit operatively connected to both electrodes of said tunnel capacitor and one of the input/output nodes, the polarities of potentials applied to both electrodes of said tunnel capacitor being changed in accordance with said data from said volatile memory cell so that electrons are injected to said floating gate with a first polarity applied and emitted from said floating gate through said tunnel capacitor with a second polarity applied thereby resulting in a potential at said floating gate as determined by said data from said volatile memory cell, and
    (d) a recall circuit connected to one of a source and drain of said first transistor and to one the input/output nodes of said volatile memory cell for recalling said data to said volatile memory cell in accordance with said potential at said floating gate, such that, even during operation of the device, when a tunnel capacitor in one of said non-volatile memory cells becomes defective, said one non-volatile memory cell becomes electrically separated from said volatile memory cell so that the other of said non-volatile memory cells is unaffected, by said one non-volatile memory cell with the defective tunnel capacitor, when providing data to said volatile memory cell.

2. A non-volatile random access memory device according to claim 1, wherein a potential at one of said floating gates of said pair of non-volatile memory cells is controlled to operate said respective first transistor into one of and ON and OFF states in accordance with said data from said volatile memory cell.

3. A non-volatile random access memory device according to claim 1, wherein a potential at one of said floating gates of said pair of non-volatile memory cells is brought to a value such that said respective first transistor is operated into an OFF state when said respective tunnel capacitor is defective.

4. A non-volatile random access memory device according to claim 1, wherein said volatile memory cell is a static random access memory cell including a flip-flop circuit.

5. A non-volatile random access memory device according to claim 1, wherein each recall circuit includes a second transistor connected to said first transistor in series, said second transistor having a gate to which a recall signal is supplied.

6. A non-volatile random access memory device according to claim 5, further comprising a test circuit for supplying a first recall signal to the gate of said second transistor included in said recall circuit in one of said non-volatile memory cells, and for supplying a second recall signal to the gate of said second transistor included in said recall circuit in the other of said non-volatile memory cells, said test circuit comprising:
    a first means for generating a first test signal for the recall circuit of one of said non-volatile memory cells;
    a second means for generating a second test signal for the recall circuit of the other of said non-volatile memory cells; and
    a third means connected to said first and second means, said third means supplying said first recall signal or said second recall signal in response to said first test signal from said first means or said second test signal from said second means when said third means does not receive a common recall signal, said third means supplying both of said first and second recall signals when said third means receives said common recall signal.

7. A non-volatile random access memory device according to claim 6, wherein each of said first means and second means comprises a test terminal, a power source terminal, an d a first and a second depletion type transistor connected in series between said test terminal and said power source terminal, one of said first test signal and said second test signal being generated from a connection point of said first and second depletion type transistors.

8. A non-volatile random access memory device according to claim 6, wherein said third means comprises a first OR gate receiving said first test signal and said common recall signal and a second OR gate receiving said second test signal and said common recall signal.

9. A non-volatile random access memory device having a plurality of memory cells, each of said memory cells comprising:
- a volatile memory cell for storing data received and having input/output nodes for inputting and outputting the data; and
- a pair of non-volatile memory cells, connected to the input/output nodes of said volatile memory cell, for storing said data from said volatile memory cell and for recalling stored data to said volatile memory cell, each non-volatile memory cell of said pair of non-volatile memory cells including
  (a) a first transistor having a floating gate,
  (b) a tunnel capacitor having one electrode connected to said floating gate,
  (c) a write circuit operatively connected to both electrodes of said tunnel capacitor and one of the input/output nodes, the polarities of potentials applied to both electrodes of said tunnel capacitor being changed in accordance with said data from said volatile memory cell so that electrons are injected to said floating gate with a first polarity applied and emitted from said floating gate through said tunnel capacitor with a second polarity applied thereby resulting in a potential at said floating gate as determined by said data from said volatile memory cell, and
  (d) a recall circuit connected to one of a source and drain of said first transistor and to one of the input/output nodes of said volatile memory cell for recalling said data to said volatile memory cell in accordance with said potential at said floating gate,
said potential at said floating gate being controlled so as to operate said first transistor in one of an ON and OFF states in accordance with said data from said volatile memory cell such that said potential at said floating gate operates said first transistor into an OFF state when said tunnel capacitor is defective,
wherein said first transistor being operated into an OFF state when said tunnel capacitor is defective causes said non-volatile memory cell having said defective tunnel capacitor to be electrically separated from the input/output nodes of the volatile memory cell thereby allowing the other of said pair of said non-volatile memory cells to recall said data to said volatile memory without effect from said non-volatile memory cell with said defective tunnel capacitor;
wherein the recalling of said data to said volatile memory cell occurs from both of said pair of non-volatile memory cells.

* * * * *